United States Patent [19]

Interiano et al.

[11] Patent Number: 5,200,689
[45] Date of Patent: Apr. 6, 1993

[54] BATTERY CHARGE MONITOR TO DETERMINE FAST CHARGE TERMINATION

[75] Inventors: Armando Interiano, Houston; Randall L. Hess, Cypress; Patrick R. Cooper, Houston; Joseph F. Freiman, Cypress, all of Tex.

[73] Assignee: Compaq Computer Corporation, Houston, Tex.

[21] Appl. No.: 824,935

[22] Filed: Jan. 24, 1992

[51] Int. Cl.$^5$ .............................................. H02J 7/00
[52] U.S. Cl. ....................................... 320/20; 320/31; 320/35; 320/37
[58] Field of Search ....................... 320/20, 31, 35, 36, 320/37

[56] References Cited

U.S. PATENT DOCUMENTS

| | | | |
|---|---|---|---|
| 3,652,915 | 3/1972 | Eberts | 320/31 |
| 4,006,397 | 2/1977 | Catotti et al. | 320/35 X |
| 4,061,956 | 12/1977 | Brown et al. | 320/22 |
| 4,118,661 | 10/1978 | Siekierski et al. | 320/40 |
| 4,209,736 | 6/1980 | Reidenbach | 320/37 X |
| 4,225,815 | 9/1980 | Lind et al. | 320/20 X |
| 4,227,141 | 10/1980 | Cross | 320/20 |
| 4,354,148 | 10/1982 | Tada et al. | 320/20 |
| 4,371,826 | 2/1983 | Shelly | 320/21 |
| 4,385,269 | 5/1983 | Aspinwall et al. | 320/20 X |
| 4,392,101 | 7/1983 | Saar et al. | |
| 4,396,880 | 8/1983 | Windebank | 320/21 |
| 4,418,310 | 11/1983 | Bollinger | 320/37 |
| 4,433,277 | 2/1984 | Carollo et al. | |
| 4,455,523 | 6/1984 | Koenck | |

(List continued on next page.)

FOREIGN PATENT DOCUMENTS

| | | |
|---|---|---|
| 3901096 | 8/1989 | Fed. Rep. of Germany . |
| 0316643 | 12/1988 | Japan . |
| 0616688 | 7/1978 | U.S.S.R. . |
| 1190429A | 11/1985 | U.S.S.R. . |

OTHER PUBLICATIONS

Compaq Computer Corporation, "Dual Battery Charger Schematic," May 19, 1989, pp. 1-4.

Primary Examiner—R. J. Hickey
Attorney, Agent, or Firm—Pravel, Gambrell, Hewitt, Kimball & Krieger

[57] ABSTRACT

A battery charge controller and fuel gauge which accurately monitors the voltage, temperature, and charge and discharge current of a rechargeable battery, and calculates the battery's charge capacity and charge level. Each time the battery is fully discharged, any calculated charge level remaining is divided by subtracted from the previously calculated charge capacity. When the battery is fully charged, the charge level is set equal to the charge capacity. During subsequent charge and discharge, the current is converted to a coulomb count and added or subtracted from the charge level to maintain an accurate charge level. Fast charge inefficiency due to temperature is considered by subtracting a temperature proportional factor before the charge level of the battery is updated. The charge level, voltage and temperature are used to determine the optimal fast charge termination point to achieve full charge and prevent temperature abuse and overcharge. A fast charge is applied only if the battery is within proper voltage and temperature ranges. The charge controller includes a microcontroller circuit within the same battery pack as the battery, which is powered by the battery when AC power is unavailable. The microcontroller circuit consumes very little power, measures circuit errors to assure data accuracy, times periods of self-discharge and updates the charge level accordingly. The microcontroller circuit also includes memory to store the battery charge information and a communication port to provide the charge information to a computer system connected to the battery pack.

5 Claims, 10 Drawing Sheets

U.S. PATENT DOCUMENTS

| | | | |
|---|---|---|---|
| 4,503,378 | 3/1985 | Jones et al. | 320/20 |
| 4,549,127 | 10/1985 | Taylor et al. | 320/21 |
| 4,553,081 | 11/1985 | Koenck | 320/35 X |
| 4,609,860 | 9/1986 | Fasen | 320/14 |
| 4,629,965 | 12/1986 | Fallon et al. | 320/20 X |
| 4,639,655 | 1/1987 | Westhaver et al. | 320/20 X |
| 4,670,703 | 6/1987 | Williams | 320/31 X |
| 4,677,363 | 6/1987 | Kopmann | 320/20 X |
| 4,709,202 | 11/1987 | Koenck et al. | 320/35 X |
| 4,727,306 | 2/1988 | Misak et al. | 320/20 X |
| 4,746,854 | 5/1988 | Baker et al. | 320/20 X |
| 4,767,977 | 8/1988 | Fasen et al. | 320/20 |
| 4,806,840 | 2/1989 | Alexander et al. | 320/20 |
| 4,820,965 | 4/1989 | Siemer | 320/31 |
| 4,843,299 | 6/1989 | Hutchings . | |
| 4,918,368 | 4/1990 | Baker et al. | 320/20 X |
| 4,947,123 | 8/1990 | Minezawa | 320/48 X |
| 4,961,043 | 10/1990 | Koenck | 320/21 |
| 5,049,804 | 9/1991 | Hutchings | 320/20 |
| 5,136,231 | 8/1992 | Faulk | 320/31 |

BATTERY CHARGE MONITOR TO DETERMINE FAST CHARGE TERMINATION

BACKGROUND OF THE INVENTION

1. Field of the Invention

The present invention is directed towards a battery charge controller for fast charging a rechargeable battery without overcharging the battery.

2. Description of the Related Art

Computers are many times needed in locations where AC power is unavailable. Rechargeable batteries are typically used as an alternative source of power, such as nickel cadmium (NiCad), and more recently nickel metal hydride (NiMH), batteries which are capable of providing power to a portable computer for several hours. Since rechargeable batteries have a limited lifespan, it is desirable to maximize the life of each battery and to obtain the maximum power from each battery during every discharge cycle. To achieve these goals, it is necessary to fully and efficiently charge the battery without causing temperature abuse and overcharging.

Many battery chargers presently in use do not efficiently charge rechargeable batteries, thereby limiting the useful life of the battery. Although some battery chargers monitor the temperature and voltage to avoid fast charging when the battery voltage is too low or the battery temperature is not within the acceptable fast charging temperature range, such as the battery chargers disclosed in U.S. Pat. application Ser. Nos. 596,223, filed Oct. 12, 1990, now U.S. Pat. No. 5,136,231, and U.S. Pat. No. 701,657, filed May 16, 1991 most known battery chargers do not have the capability to accurately determine the charge level and the total charge capacity and thus may overcharge the battery, thereby reducing its useful life. For example, many NiCad battery chargers continue fast charging until the battery voltage peaks and begins to decrease. It has been determined, however, that this negative voltage change method some times overcharges the battery, causing damage and a depression in the voltage. Typical NiMH battery chargers also tend to overcharge the battery, causing oxidizing of the hydride in the cells.

One reason for temperature abuse and overcharging of NiCad and NiMH batteries was the difficulty of determining the charge level since the voltage is substantially the same regardless of the charge level over a very broad range. Further, if the battery was removed and replaced, the system had no way of determining the charge history and the remaining charge level of the battery. Some methods estimated the charge level by monitoring the charge and discharge current through the battery over a period of time, but these methods still assumed an initial level of charge. These methods proved inaccurate when a partially discharged battery was used. Although the level of discharge may be measured for a given battery in a given system, the batteries are typically interchangeable so that if the battery was replaced, the system could not determine the charge level of the new battery. Also, rechargeable batteries tend to discharge during periods of non-use, referred to as self-discharge, so that a system which was shut down for a period of time and then powered up had no way of determining the amount of self-discharge that had occurred.

Furthermore, the total charge capacity of a battery, typically referred to as the amp-hour (AH) rating, tends to change over time and usage. For example, the charge capacity of the battery typically increases and then decreases over time and usage until the battery eventually will not hold a charge and must be replaced For example, NiCad batteries have a memory effect causing lower capacity after multiple partial charge and discharge cycles.

One particular technique used in personal computers known as Battery Watch estimates the amount of charge remaining based on elapsed time of charge and discharge, and converts this to the useful time remaining. This technique has proven unreliable since it assumes that the total charge capacity of the battery does not change over time. Further, this technique fails to keep track of the charge-in and charge-out and does not account for the self-discharge.

It is desirable therefore, to charge a battery as fast and efficiently as possible without decreasing its maximum useful life. To achieve this goal, fast charge must be terminated at the proper time without overcharging the battery. It is also desirable to accurately monitor and calculate the total charge capacity as well as the charge level at any given time, taking into account factors such as self-discharge and reduced capacity, and to provide this information to the user.

SUMMARY OF THE INVENTION

A battery charge controller and fuel gauge according to the present invention continually samples the charge and discharge current through either a Nickel Cadmium (NiCad) or a Nickel Metal Hydride (NiMH) battery, as well as the battery voltage and temperature while charging, and accurately calculates the total charge capacity and remaining charge level in the battery. The present invention includes a microcontroller circuit with memory and a communication port, all located in the same battery pack as the battery, and powered by the battery itself. In this manner, the battery controller monitors the battery charge status at all times, stores the charge information, and provides the charge information to a computer system coupled to the battery pack.

The total charge, or "tank" capacity to use a convenient analogy, is originally assumed to be the amp-hour (AH) rating defined by the battery cell manufacturer but is continually updated over time and usage. More specifically, when the battery reaches a full discharge as determined by a predetermined discharge voltage level, any remaining calculated charge level, whether positive or negative, is divided by 2 and subtracted from the previously calculated tank capacity, thereby providing a new tank capacity. Over successive cycles the tank capacity value thus adapts to the particular battery's condition. When the battery is fully charged, the charge level is set equal to the tank capacity.

A charge controller circuit according to the present invention includes a "fuel gauge", to continue the analogy, which accurately indicates the remaining charge level in the battery at any time. The charge controller circuit constantly samples the charge or discharge current through the battery and converts this to a coulomb or charge quantity count which is added to or subtracted from the charge level. The microcontroller periodically measures the offset voltages causing inaccuracies of the current measuring circuits and subtracts the offsets to assure data accuracy. The present invention maintains an accurate level of the charge by accounting for charging inefficiencies by subtracting a factor proportional to the temperature from the charging coulomb count while the battery is fast charging. Also, the number of seconds of charge remaining can be computed by dividing the charge level by the discharge instantaneous rate.

A charge controller circuit according to the present invention also monitors the battery self-discharge by timing the period of non-use and subtracting a percentage of the total charge due to self-discharge based on the non-use time period.

A charge controller circuit according to the present invention also accurately determines the optimal point of fast charge termination for different types of batteries, including NiCad and NiMH batteries. During fast charge, the circuit monitors changes in the voltage and temperature of the battery. If the charge capacity and voltage of the battery are above predetermined levels, and if the voltage stabilizes while the temperature rises a predetermined amount, then fast charge is terminated. This particular method works for both types of batteries and prevents temperature abuse and overcharge. Once the fast charge is terminated, a topoff charge at a certain predetermined trickle current is provided for a predetermined short period of time. After topping off, a stabilizing trickle amount is provided. By monitoring the charge capacity, as well as the voltage and temperature changes and utilizing the topoff charge, temperature abuse of the batter 13 greatly reduced or eliminated, extending the useful life and capacity of the battery.

BRIEF DESCRIPTION OF THE DRAWINGS

A better understanding of the invention can be had when the following detailed description of the preferred embodiment is considered in conjunction with the following drawings, in which.

DETAILED DESCRIPTION OF THE PREFERRED EMBODIMENT

Figure 1:
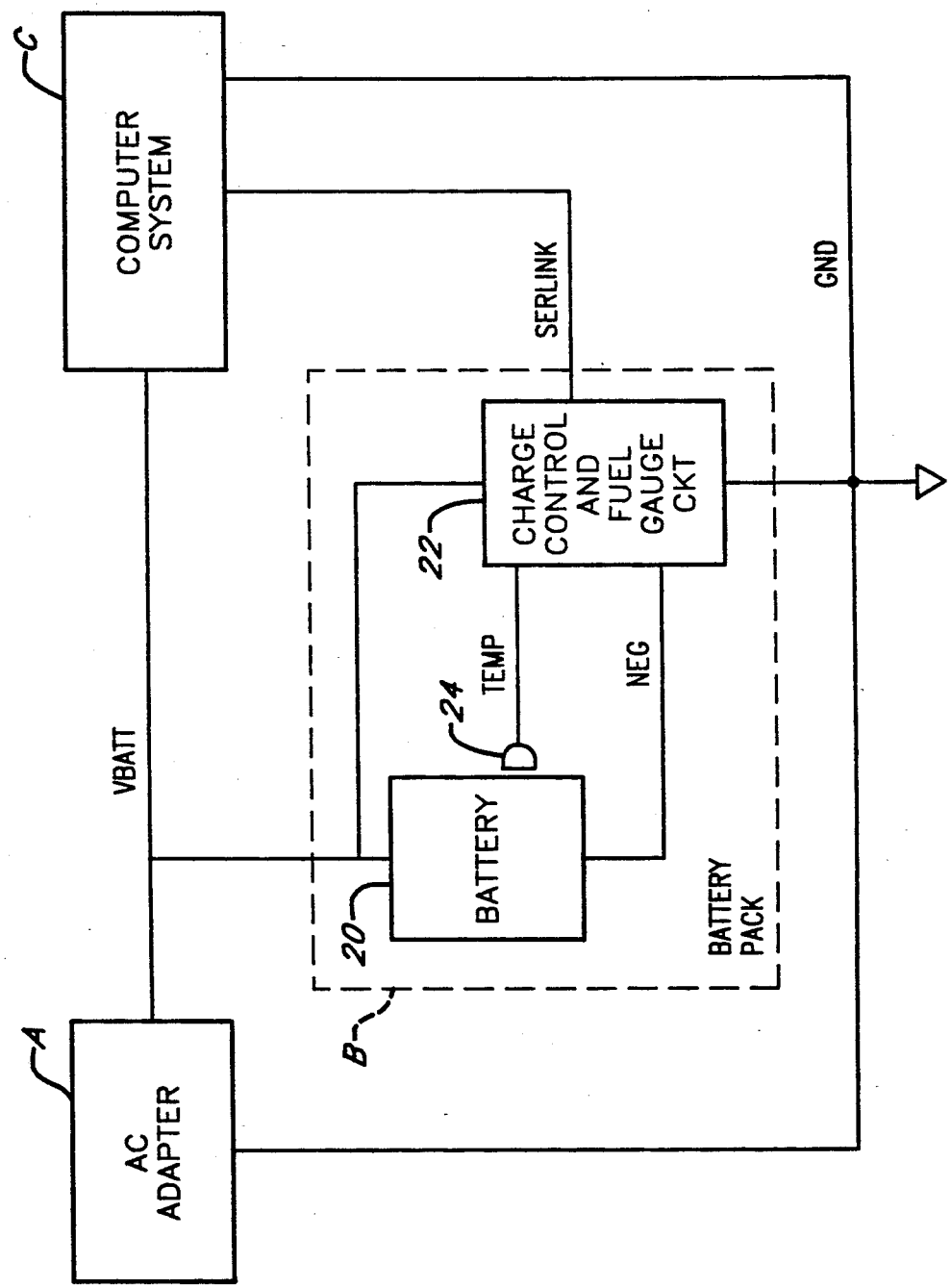
FIG. 1 is a schematic block diagram of a computer system using the battery charge controller and monitor according to the present invention.

Referring now to FIG. 1, a computer system C is shown connected to a removably connected battery pack B and a removably connected AC adapter A. The computer system C is designed to receive power from the AC adapter A, or from the battery pack B when AC power is not readily available. The AC adapter A converts AC power to provide a voltage of preferably 18 volts between a signal VBATT and ground, which is connected to the computer system C. The battery pack B is connected between the VBATT signal and ground and preferably provides a nominal voltage of approximately 13 volts between the VBATT signal and ground to the computer system C when the AC adapter A is not connected.

The AC adapter A also provides power to charge a rechargeable battery 20 within the battery pack B. The battery pack B could also be removed and placed in a separate fast charge unit (not shown). Both the AC adapter A and the fast charge unit provide power to charge the battery 20 in a very similar manner, so that only the AC adapter A will be discussed.

The rechargeable battery 20 is preferably a 10 cell nickel-cadmium (NiCad) or a nickel-metal hydride (NiMH) battery having a positive terminal connected to the VBATT signal and a negative terminal connected to a signal referred to as NEG. The battery 20 preferably provides a nominal voltage of 13.2 volts between the VBATT and NEG signals when the battery 20 is fully charged, although this voltage will vary slightly depending upon the charge level of the battery 20, and usually increases when the battery 20 is being charged. If the battery 20 is a NiMH type battery, it will preferably have an original amp-hour (AH) rating of 1.95 AH as specified by the manufacturer. If the battery is a Ni-Cad battery, it will preferably have a rating of 1.65 AH. The AH rating determines the original charge capacity of the battery 20, otherwise referred to as the tank capacity or denominator, although the charge capacity will change over time and usage. In practice, the AH rating is actually derived from the battery cell manufacturer's specification sheet, by calculating the total number of coulombs provided by discharging a fully charged battery cell until its voltage becomes equal to a discharged voltage level, which is preferably 1.1 volts for each cell of the battery 20. The 1.95 AH rating for NiMH and the 1.65 AH rating for NiCad is slightly lower than the derived ratings so that a new battery pack eventually builds up its capacity to the derived ratings.

In the preferred embodiment, a charge control and monitor circuit 22 is contained within the same battery pack B as the battery 20 and is connected to the VBATT and NEG signals. A temperature sensor 24, which is preferably an LM 35 from National Semiconductor, is coupled in good thermal contact with the battery 20 and provides a signal TEMP having a voltage level proportional to the temperature of the battery 20. The TEMP signal is provided to the charge control and monitor circuit 22. The charge control and monitor circuit 22 includes a serial communication port for providing and receiving data on a signal referred to as SERLINK. The computer system C is connected to the SERLINK signal and preferably includes an 80C51 keyboard controller so that the computer system C and the charge control and monitor circuit 22 can exchange serial data across the SERLINK signal, preferably at a rate of 1200 bits per second. This communication link will be further described below.

Figure 2:
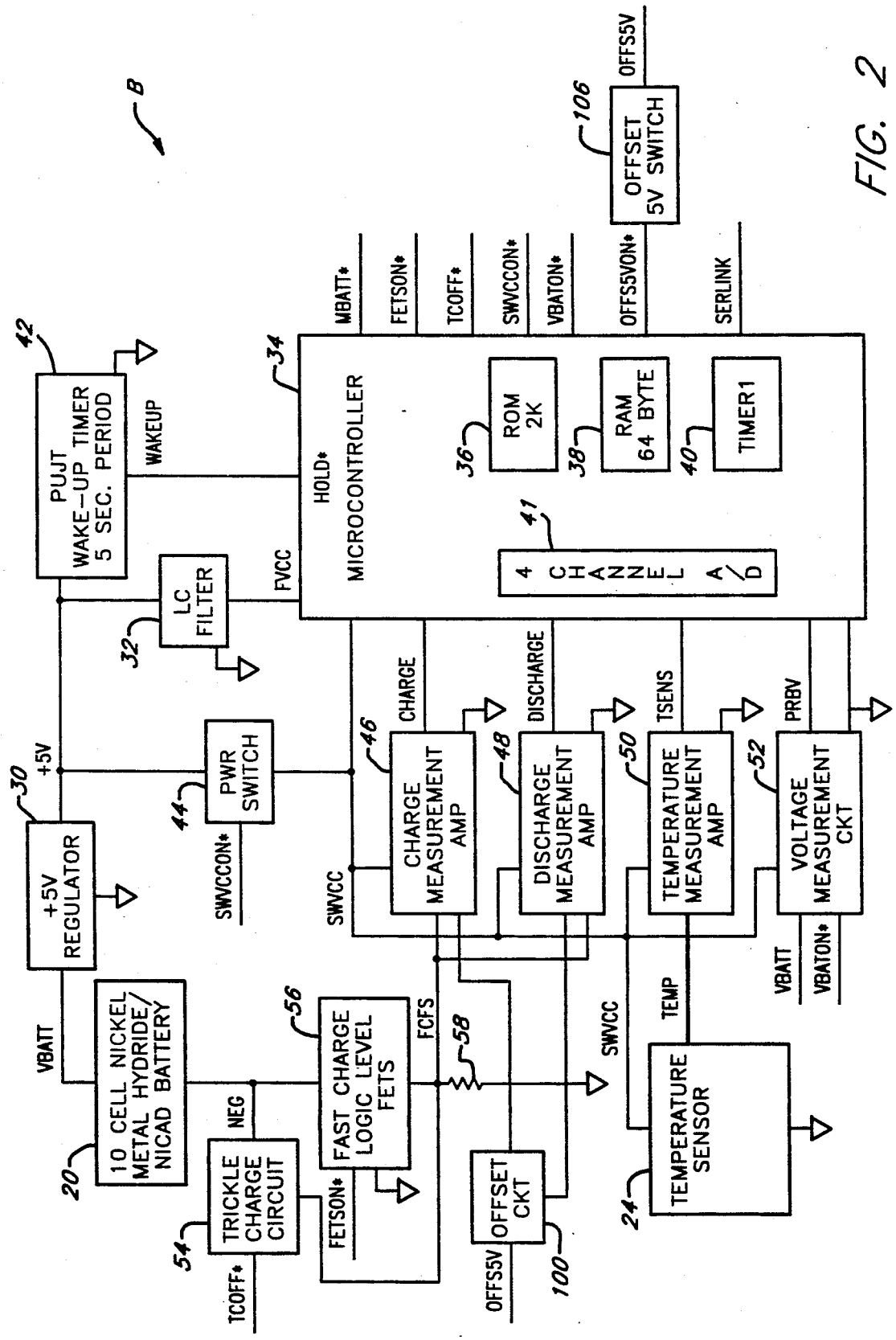
FIG. 2 is a schematic block diagram of the battery pack of FIG. 1.
Figure 3A:
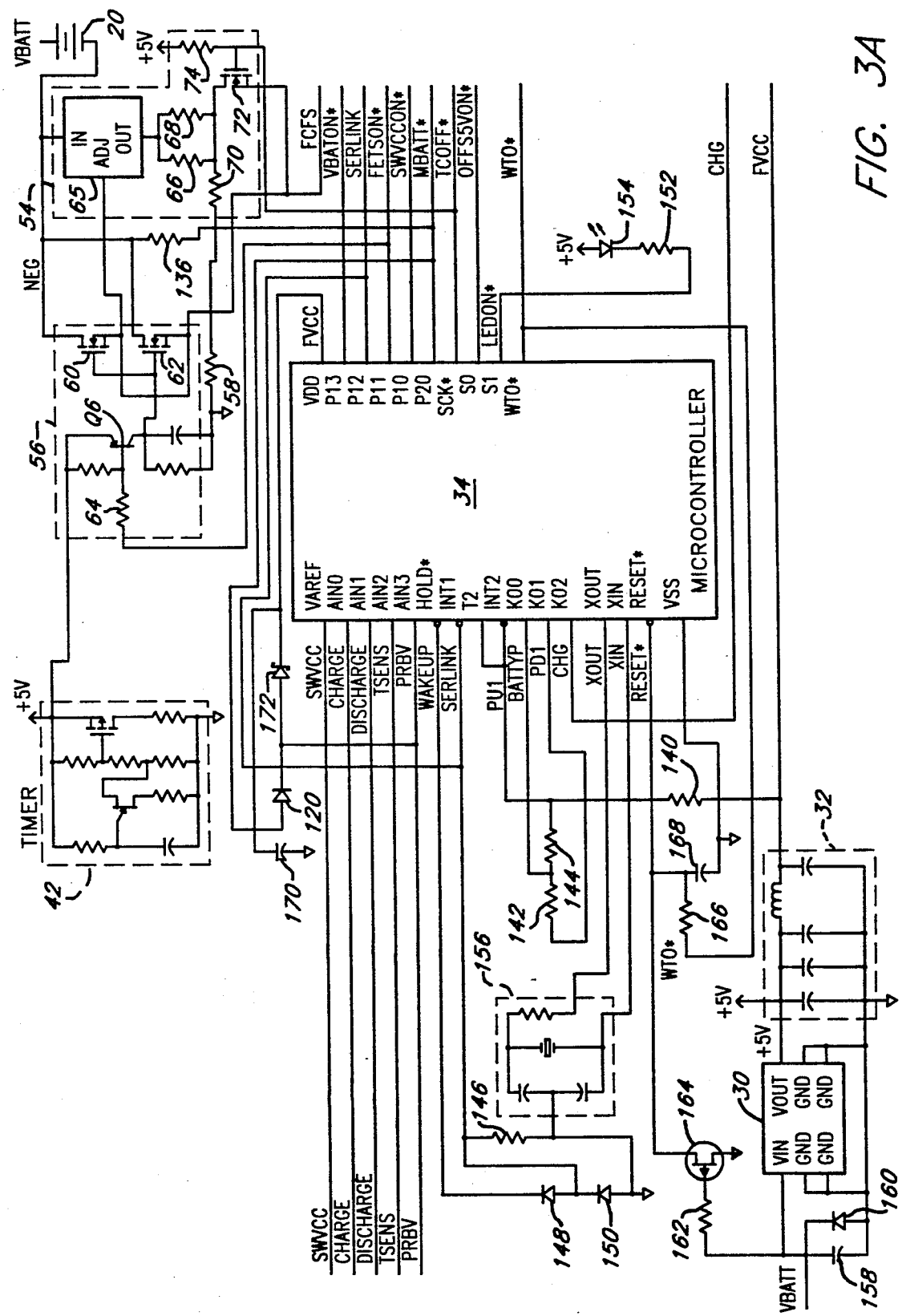
FIGS. 3A and 3B are more detailed schematic diagrams of the battery pack of FIG. 1.
Figure 3B:
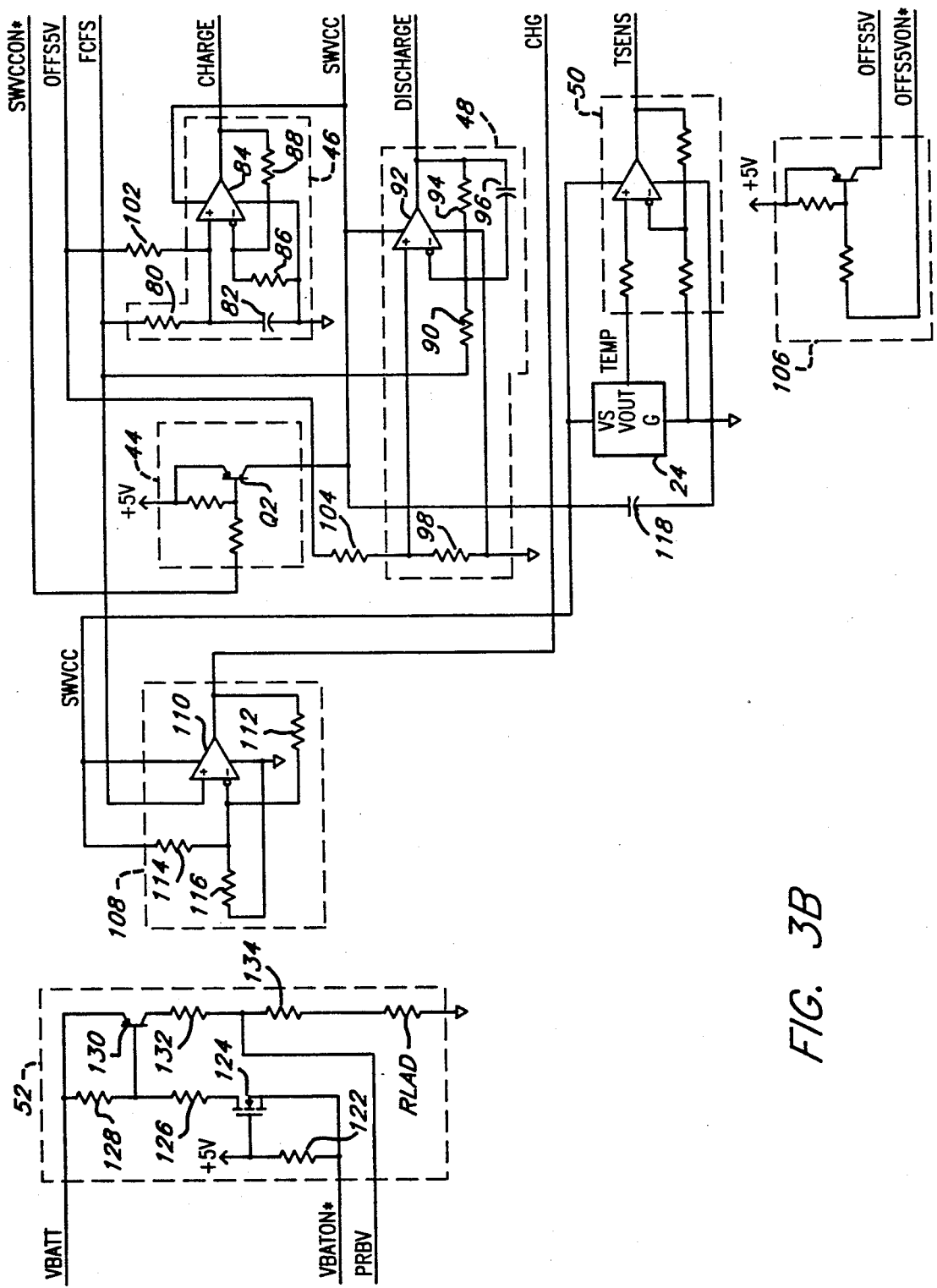

Referring now to FIG. 2, a simplified block diagram of the battery pack B of FIG. 1 is shown. FIGS. 3A and 3B include further details of the battery pack B and will be referred to throughout the discussion of FIG. 2. The positive terminal of the battery 20, which is the VBATT signal, is connected to the input of a voltage regulator, preferably an LM2936, which provides a 5 volt power source signal referred to as +5V. The +5V signal is filtered by an LC filter 32 which provides a filtered 5 volt signal referred to as FVCC. The FVCC signal is connected to the VCC input terminal of a microcontroller 34, which is preferably a TMP47C241 CMOS 4-bit microcontroller manufactured by Toshiba Corporation. The microcontroller 34 includes a 2k byte read only memory (ROM) 36, a 64 byte random access memory (RAM) 38, an internal timer 40 and a 4-bit serial interface connected to the SERLINK signal. Four analog inputs of the microcontroller 34, referred to as AIN0, AIN1, AIN2 and AIN3, respectively, are connected to an internal 8 bit analog to digital (A/D) converter 41 which converts an analog signal provided to any one of the AIN0–AIN3 inputs to a proportional 8 bit binary number, read as two hexadecimal digits. A switched 5 volt signal referred to as SWVCC, further described below, is connected to the microcontroller 34 to provide an analog reference voltage to the internal A/D converter 41.

The microcontroller 34 preferably includes a hold function so that when it is placed on hold, or put to sleep, it draws very little power from the battery 20. This is done when the battery pack B is removed from the AC adapter A and computer system C since the charge control and monitor circuit 22 must derive all of its power from the battery 20. The microcontroller 34 thus includes an input HOLD* which is connected to a signal WAKEUP which provides a sleep request when the WAKEUP signal is pulled high. An asterisk at the end of a signal name or input refers to a signal being active when asserted low, unless otherwise specified, and is the inverse of the signal name without the asterisk. The microcontroller 34 operates normally when the WAKEUP signal is high.

The +5V signal is connected to the input of a programmable unijunction transistor (PUJT) circuit 42, which has an output connected to the WAKEUP signal. The PUJT circuit 42 operates as a wakeup timer with a period of 5 seconds, which resistively pulls the WAKEUP signal low during most of the 5 second period if the WAKEUP signal is not otherwise asserted high, but asserts a high pulse on the WAKEUP signal once every 5 seconds to wake up the microprocessor 34. The PUJT circuit 42 is used rather than known commercially available timers since it consumes significantly less power, and thus allows longer period of self-discharge before the battery 20 becomes fully discharged. A diode 148 (FIG. 3A) has its cathode connected to the WAKEUP signal and its anode connected to the SERLINK signal so that the WAKEUP signal is pulled high when the SERLINK signal is asserted high.

The +5V signal is connected to a power switch 44 which is controlled by a signal SWVCCON* provided by the microcontroller 34. The switch 44 provides the switched SWVCC signal, which is preferably about 5 volts. When the microcontroller 34 pulls the SWVCCON* signal high, the SWVCC signal is switched off, providing an open collector output. When the SWVCCON* signal is asserted low, the power from the +5V signal is provided to the SWVCC signal.

The SWVCC signal is connected and provides power to a charge measurement amplifier 46, a discharge measurement amplifier 48, a temperature measurement amplifier 50, a voltage measurement circuit 52 and the temperature sensor 24. The operation and function of the charge, the discharge, the temperature and the voltage measurement amplifiers 46–52 will be described in more detail below. For now, these circuits are turned on and draw power only when the SWVCC signal is switched on. In this manner, the charge control and monitor circuit 22 activates the measurement amplifiers 46–52 and the temperature sensor 24 only when, and only for as long as, necessary to draw as little power from the batter 20 as possible. This is important when the AC adapter A is disconnected and the battery 20 is discharging into the computer system C.

The negative terminal of the battery is connected to the NEG signal, which is also connected to a trickle charge circuit 54 and to a fast charge circuit 56. The trickle charge circuit 54 and the fast charge circuit 56 are both connected to a signal FCFS which is connected to one side of a sense resistor 58, and the other side of the sense resistor 58 is connected to ground. The NEG signal is connected to the drain terminals of two n-channel enhancement metal oxide semi-conductor field effect transistors (MOSFETs) 60 and 62 (FIG. 3A), and the source terminals of the MOSFETs 60 and 62 are connected to the FCFS signal. The gate terminals of the MOSFETs 60 and 62 are connected to the collector terminal of a PNP bipolar transistor Q6. A signal FETSON* from the microcontroller 34 is connected to one side of a resistor 64, and the other side of the resistor 64 is connected to the base of the transistor Q6. The emitter of the transistor Q6 is connected to the +5V signal.

The MOSFETs 60 and 62 are coupled in parallel to decrease their effective resistance when turned on and also to increase current handling capability. When the FETSON* signal is asserted high, the transistor Q6 is biased off, thereby turning the MOSFETs 60 and 62 off. When the MOSFETs 60 and 62 are turned off, a very high impedance appears between their drain and source terminals, thereby effectively removing the fast charge circuit 56 from the charge path of the battery 20 so that the trickle charge circuit 54 controls the current through the battery 20. However, the MOSFETs 60 and 62 have an internal diode between their source and drain terminals which allows some power to be delivered by the battery 20 to the computer system C when the MOSFETs 60 and 62 are turned off. When the FETSON* signal is asserted low, the transistor Q6 is biased on, thereby turning on the MOSFETs 60 and 62, causing a very low impedance between the drain and source terminals of the MOSFETs 60 and 62, thereby effectively removing the trickle charge circuit 54 from the charge path circuit of the battery 20.

The trickle charge circuit 54 preferably includes an LM317 three terminal adjustable regulator 65, such as that manufactured by National Semiconductor, having its input terminal connected to the NEG signal, its adjust terminal connected to the FCFS signal and its output terminal connected to one side of two resistors 66 and 68. The other side of the resistors 66 and 68 are connected to one side of resistor 70 and to the drain terminal of an n-channel enhancement MOSFET transistor 72. The source terminal of the MOSFET transistor 72 and the other side of the resistor 70 are connected to the FCFS signal, and the gate terminal of the MOSFET 72 is connected to one side of a pullup resistor 74. The other side of the resistor 74 is connected to the +5V signal. The gate terminal of the MOSFET 72 is also connected to a signal TCOFF* which is provided by the microcontroller 34. The regulator 65 operates as a current source, the level of current depending upon the effective resistance between its adjust and output terminals.

In this manner, when the FETSON* signal is pulled high and the battery 20 is trickle charging through the trickle charge circuit 54, the microcontroller 34 controls the level of the trickle charge current with the TCOFF* signal. When the TCOFF* signal is asserted low by microcontroller 34, the MOSFET 72 is switched off so that the trickle current flows through the resistor 70. The regulator 65 and the resistors 66, 68 and 70 preferably limit the trickle current to about five milliamps. The five milliamp trickle current is referred to as a maintenance charge current capable of maintaining the charge level of the battery 20. When the TCOFF* signal is asserted low, the MOSFET 72 is turned on, thereby effectively bypassing the resistor 70, preferably increasing the trickle charge current to approximately 100 milliamps. The 100 milliamp trickle current is used to bring the battery 20 within proper temperature and voltage ranges before fast charging, and as a topoff charge after a fast charge has been completed.

Effectively all of the current through the battery 20 passes through the sense resistor 58, so that the voltage of the FCFS signal is proportional to the current through the battery 20, unless the FCFS signal is otherwise grounded. The FCFS signal is provided to the charge and the discharge measurement amplifiers 46 and 48. The FCFS signal is connected to one side of a resistor 80 (FIG. 3B) and the other side of the resistor 80 is connected to one side of a capacitor 82 and to the non-inverting terminal of an operational amplifier 84. The other side of the capacitor 82 is connected to ground and to one side of a resistor 86, and the other side of the resistor 86 is connected to the inverting input of the operational amplifier 84. A feedback resistor 88 is coupled between the inverting input and the output of the operational amplifier 84, and the output of the amplifier 84 is a signal referred to as CHARGE. The operational amplifier 84 receives power between the switched SWVCC signal and ground.

The operational amplifier 84 is preferably configured so that the CHARGE signal has a voltage level of approximately 19.25 millivolts per 10 milliamps of charge current through the battery 20. The CHARGE signal is provided to the AIN0 input of the microcontroller 34, so that the microcontroller 34 can convert the charge current through the battery 20 to a two digit hexadecimal value and store this value into the internal RAM 38. When the battery 20 is discharging, the FCFS signal goes negative and the CHARGE signal is essentially forced to zero and thus will not measure a discharge current.

The discharge measurement amplifier 48 operates in a similar manner as the charge measurement amplifier 46. The FCFS signal is connected to one side of resistor 90 and the other side of the resistor 90 is connected to the inverting input of a operational amplifier 92. A resistor 94 and a capacitor 96 are coupled in parallel between the inverting input and the output of the operational amplifier 92. The noninverting input of the operational amplifier 92 is connected to one side of a resistor 98 and the other side of the resistor 98 is connected to ground. The output of the operational amplifier 92 provides a signal referred to as DISCHARGE which is connected to the AIN1 input of the microcontroller 34. The discharge measurement amplifier 48 is preferably configured so that the DISCHARGE signal has a voltage level of 19.25 millivolts per 10 milliamps of discharge current through the battery 20. The microcontroller 34 converts the discharge current into a proportional 2 digit hexadecimal value, which can then be stored in the internal RAM 38. While the battery 20 is being charged, the DISCHARGE signal is essentially driven to zero.

The operational amplifiers 84 and 90 include significant amounts of offset voltages which are essentially added to the charge and discharge currents, causing inaccurate levels of the CHARGE and DISCHARGE signals. The battery charge controller and fuel gauge circuit 22 includes the offset circuit 100 so that the microcontroller 34 can subtract out the effect of the offset voltages to obtain accurate measurements of the charge and discharge currents. The microcontroller 34 provides a signal OFFS5VON* to an offset switch 106 which provides a signal OFFS5V. When the OFFS5VON* signal is asserted low, the OFFS5V signal is asserted high to approximately 5 volts, and if the OFFS5VON* signal is high, the OFFS5V signal is an open collector output. The OFFS5V signal is connected to one side of resistors 102 and 104, which comprise the offset circuit 100. The other side of the resistor 102 is connected to the non-inverting input of the amplifier 84, and the other side of the resistor 104 is connected to the non-inverting input of the amplifier 92.

During normal measurements of the charge and discharge currents, the OFFS5VON* signal is high so that the OFFS5V signal is open circuited, thereby eliminating the affect of the resistors 102 and 104 from the charge and discharge measurement amplifiers 46 and 48. However, when the OFFS5VON* signal is asserted low by the microcontroller 34, and when the FETSON* signal is high, thereby bringing the FCFS signal to a low level, the OFFS5V signal preferably places a bias of approximately 3.5 millivolts at the non-inverting input of the operational amplifiers 84 and 92 as determined by the resistors 102 and 80, and by the resistors 104 and 98, respectively. If the operational amplifiers 84 and 92 were ideal with no offset voltages, then the CHARGE and DISCHARGE signals would both be approximately 135 millivolts, which would preferably be converted to a hexadecimal value of 7 by the microcontroller 34. The actual hexadecimal values are subtracted from 7 to provide hexadecimal charge and discharge offset values which are then stored by the microcontroller 34 and subtracted from subsequent received values of the CHARGE and DISCHARGE signals, respectively. In this manner, the error caused by the offset voltages of the operational amplifiers 84 and 92 is virtually eliminated.

In spite of the measured offset voltages as described above, during very small levels of charge and discharge current the microcontroller 34 is unable to distinguish from the CHARGE and DISCHARGE signals whether the battery 20 is actually charging or discharging. Thus, a charge bit circuit 108 (FIG. 3B) is provided. The FCFS signal is provided to the non-inverting input of an operational amplifier 110 and a resistor 112 is coupled between the inverting input and the output of the amplifier 110. The operational amplifier 110 is powered by the switched SWVCC signal. One side of resistors 114 and 116 is connected to the inverting input of the operational amplifier 100, and the other side of the resistor 114 is connected to the SWVCC signal. The other side of the resistor 116 is connected to ground. The output of the operational amplifier 110 is a signal referred to as CHG, which is provided as an input to the microcontroller 34. The operational amplifier 110 is configured as a high gain non-inverting amplifier so that when the battery 20 is charging, the FCFS signal is positive and the CHG signal is high, and when discharging, the FCFS signal is negative and the CHG signal is low.

A filter capacitor 118 is coupled between the SWVCC and ground to provide filtering for the temperature sensor 24. The temperature sensor 24 provides a signal TEMP at its output which preferably has a voltage level of 10 millivolts per degree Celsius (° C. g.) of the temperature of the battery 20. The TEMP signal is provided to the input of the temperature measurement amplifier 50 which provides the TSENS signal, which is connected to the AIN2 analog input of the microcontroller 34. The temperature measurement amplifier 50 preferably has a gain of approximately 10 so that the TSENS signal has a level of 100 millivolts per ° C. of the temperature of the battery 20.

To measure the voltage across the battery 20, it is necessary to first measure the voltages of the VBATT and the NEG signals while the MOSFETs 60 and 62 are switched off and then take the difference. The microcontroller 34 provides a signal MBATT* which is used by the microcontroller 34 to measure the voltage across the battery 20. A resistor 136 is connected between the MBATT* and the NEG signals. The MBATT* signal is also connected to the anode of a diode 120 and the cathode of the diode 120 is connected to a signal PRBV which is provided to the AIN3 input of the microcontroller 34. The microcontroller 34 provides a signal VBATON* which is provided to one side of a resistor 122 (FIG. 3B) and to the source terminal of an n-channel enhancement MOSFET transistor 124. The gate of the MOSFET 124 and the other side of the resistor 122 are connected to the +5V signal. The drain of the MOSFET 124 is connected to one side of a resistor 126 and the other side of the resistor 126 is connected to one side of a resistor 128 and to the base terminal of a PNP transistor 130. The other side of the resistor 128 and the emitter of the transistor 130 are connected to the VBATT signal. The collector of the transistor 130 is connected to one side of the resistor 132 and the other side of the resistor 132 is connected to the PRBV signal. The PRBV signal is also connected to one side of a resistor 134 and the other side of the resistor 134 is connected to a resistor RLAD and the other side of the resistor RLAD is connected to ground.

To measure the voltage of the VBATT signal, the MBATT* and the VBATON* signals are asserted low, thus reverse biasing the diode 120 and activating the MOSFET 124 which activates the transistor 130. The VBATT signal is thus placed across the transistor 130 and the resistor divider comprising the resistors 132, 134 and RLAD. The voltage level of the PRBV signal is therefore proportional to the VBATT signal, which is sampled by the microcontroller 34. In practice, the RLAD resistor is a programmable resistor ladder provided for accuracy and set by the manufacturer. To measure the voltage of the NEG signal, the MBATT* and the VBATON* signals are pulled high. The MBATT* signal is essentially open circuited by the microcontroller 34 so that the NEG signal appears across the resistor 136 and forward biases the diode 120. The VBATON* signal inactivates the MOSFET transistor 124 as well as the transistor 130, thereby effectively removing the affect of the VBATT signal. Thus, the NEG signal is provided across a voltage divider comprising the resistor 136, the diode 120 and the resistors 134 and RLAD. Now, the PRBV signal is a voltage proportional to the NEG signal which is provided to the microcontroller 34.

FIG. 3A includes additional circuitry which will now be briefly described. The internal timer 40 is connected to a T2 output of the microcontroller 34. The T2 output is connected to a signal PUI and the PUI signal is connected to one side of a pullup resistor 140 and the other side of the resistor 140 is connected to the FVCC signal. The PUI signal is also connected to an interrupt input of the microcontroller 34 referred to as INT2*. The resistor 140 normally pulls the PUI signal to the 5 volt level of the FVCC signal. The timer 40 is programmed at approximately 10 Hz, preferably having a period of 0.103 seconds so that the timer 40 pulls the PUI signal low once every 0.103 seconds, which asserts the INT2* input of the microcontroller 34 low. As will be described in more detail below, when the INT2* signal is pulled low, the microcontroller 34 executes an interrupt routine and samples the CHARGE, DISCHARGE, TSENS, VBATT and the NEG signals.

The microcontroller 34 is connected to a signal BATTYP and the signal BATTYP is connected to one side of a resistor 142 and to one side of a resistor 144. The other side of the resistor 142 is connected to a signal PDI and the PDI signal is connected to the microcontroller 34. The other side of the resistor 144 is connected to the PUI signal. However, only one of the resistors 142 and 144 is installed so that the other is left open circuited. The resistor 142 corresponds to a NiMH battery and is installed if a NiMH battery is used. The resistor 144 is installed if a NiCad battery is used. The microcontroller 34 asserts the PDI signal low and monitors the BATTYP signal, which is high if a NiCad battery is installed and low if a NiMH battery is installed.

The SERLINK signal provided by the microcontroller 34 is connected to an interrupt input INTI* of the microcontroller 34, and is also connected to one side of a resistor 146 and to the cathode of a diode 150. The other side of the resistor 146 and the anode of the diode 150 are connected to ground. When the battery pack B is connected to a fast charger or to the computer system C, an external pullup resistor normally keeps the SERLINK signal pulled high. Otherwise, the SERLINK signal is pulled low through the resistor 146. If the AC adapter A is connected, the VBATT signal is greater than 17 volts as long as the MOSFETS 60 and 62 are switched off. Thus, the microcontroller 34 can monitor the SERLINK and VBATT signals to determine if an AC power source is available for fast charging.

The microcontroller 34 provides an output signal LEDON* which is connected to one side of a resistor 152 and the other side of the resistor 152 is connected to the cathode of a light emitting diode (LED) 154. The cathode of the LED 154 is connected to the +5V signal. The microcontroller 34 can turn on the LED 154 by asserting the LEDON* signal low, thereby indicating that the battery 20 is being fast charged or about to be fast charged. A 440 kilohertz ceramic resonator 156 is connected to the XOUT and XIN inputs of the microcontroller 34 to provide a clocking signal.

The VBATT signal is connected to one side of a filter capacitor 158 and to the cathode of a diode 160 and the other side of the capacitor 158 and the anode of the diode 160 is connected to ground. The VBATT signal is also connected to one side of a resistor 162 and the other side of the resistor 162 is connected to the gate terminal of a p-channel depletion type junction field effect transistor (JFET) 164. The drain terminal of the JFET 164 is connected to ground and the source terminal is connected to a signal RESET* which is connected to a RESET* input of the microcontroller 34. The RESET* signal is also connected to one side of a resistor 166 and to one side of a capacitor 168 and the other side of the capacitor 168 is connected to ground. The other side of the resistor 166 is connected to a signal WTO* and the WTO* signal is provided to the WTO* input of the microcontroller 34.

Normally, the WTO* signal is high and the battery 20 is installed in the battery pack B so that the JFET 164 is turned off and the RESET* signal is pulled high. However, if the battery 20 discharges to approximately 5 volts, the JFET 164 pulls the RESET* signal low thereby resetting the microcontroller 34. Thus, at low levels of voltage where the microcontroller 34 may lose its memory, the JFET 164 resets the microcontroller 34 to ensure proper operation. The microcontroller 34 includes a watch dog timer which normally keeps the WTO* signal high unless it times out. This does not occur under normal operation although if the microcontroller 34 operates out of control, the watch dog time resets the microcontroller 34.

A filter capacitor 170 is coupled between ground and the FVCC signal for the microcontroller 34. Also, the anode of a Schottky diode is connected to the PRBV signal and the cathode of the diode 172 is connected to the FVCC signal so that the PRBV signal does not go below the FVCC voltage minus the voltage of the diode 172.

Figure 4A:
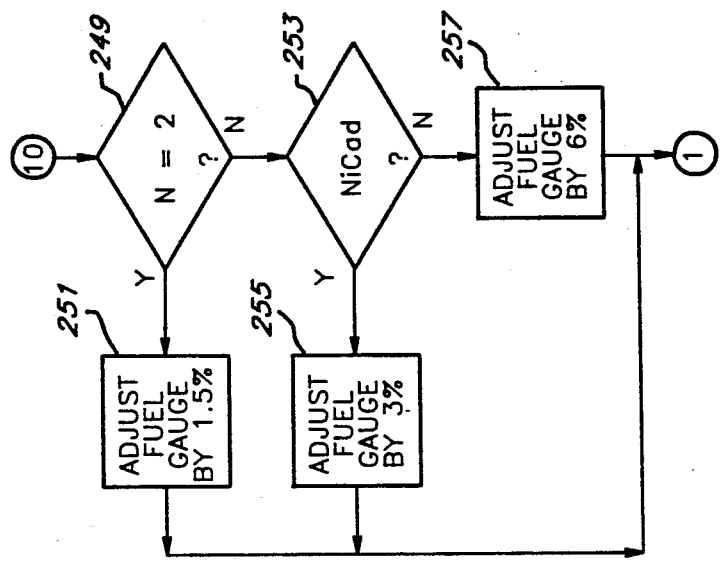
FIGS. 4A-4E are flowchart diagrams illustrating the operation of a software program according to the present invention operating on the microcontroller of FIG. 2.
Figure 4A:
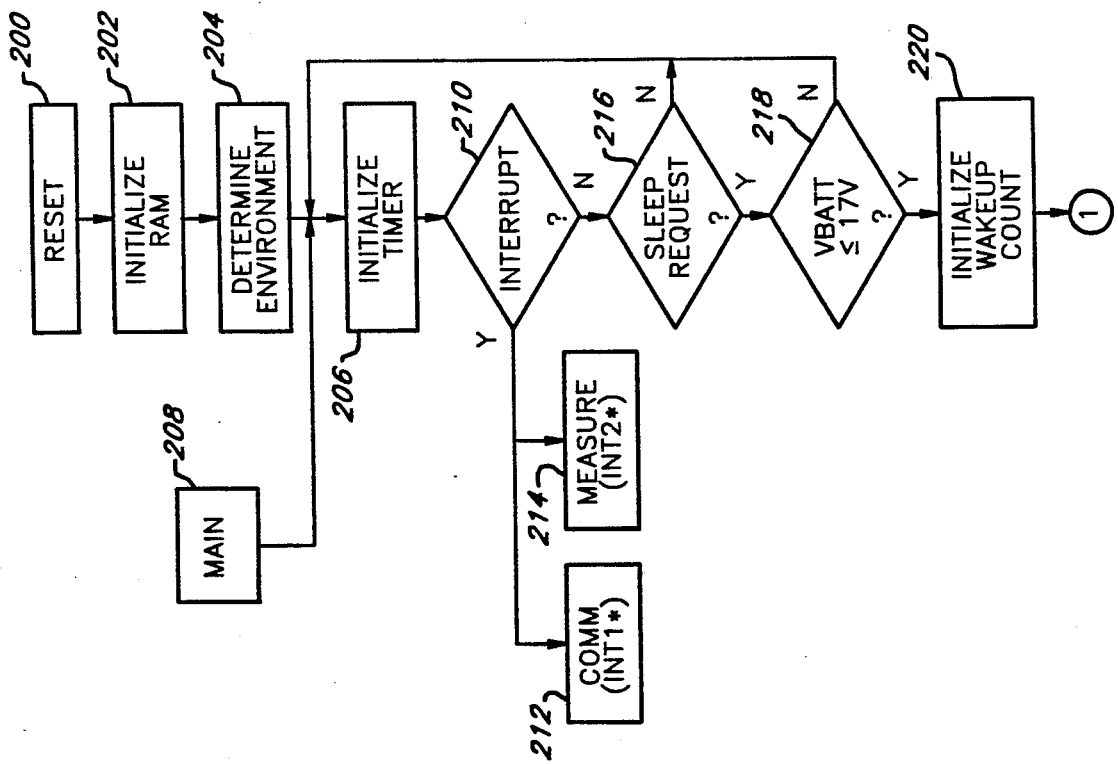
Figure 4B:
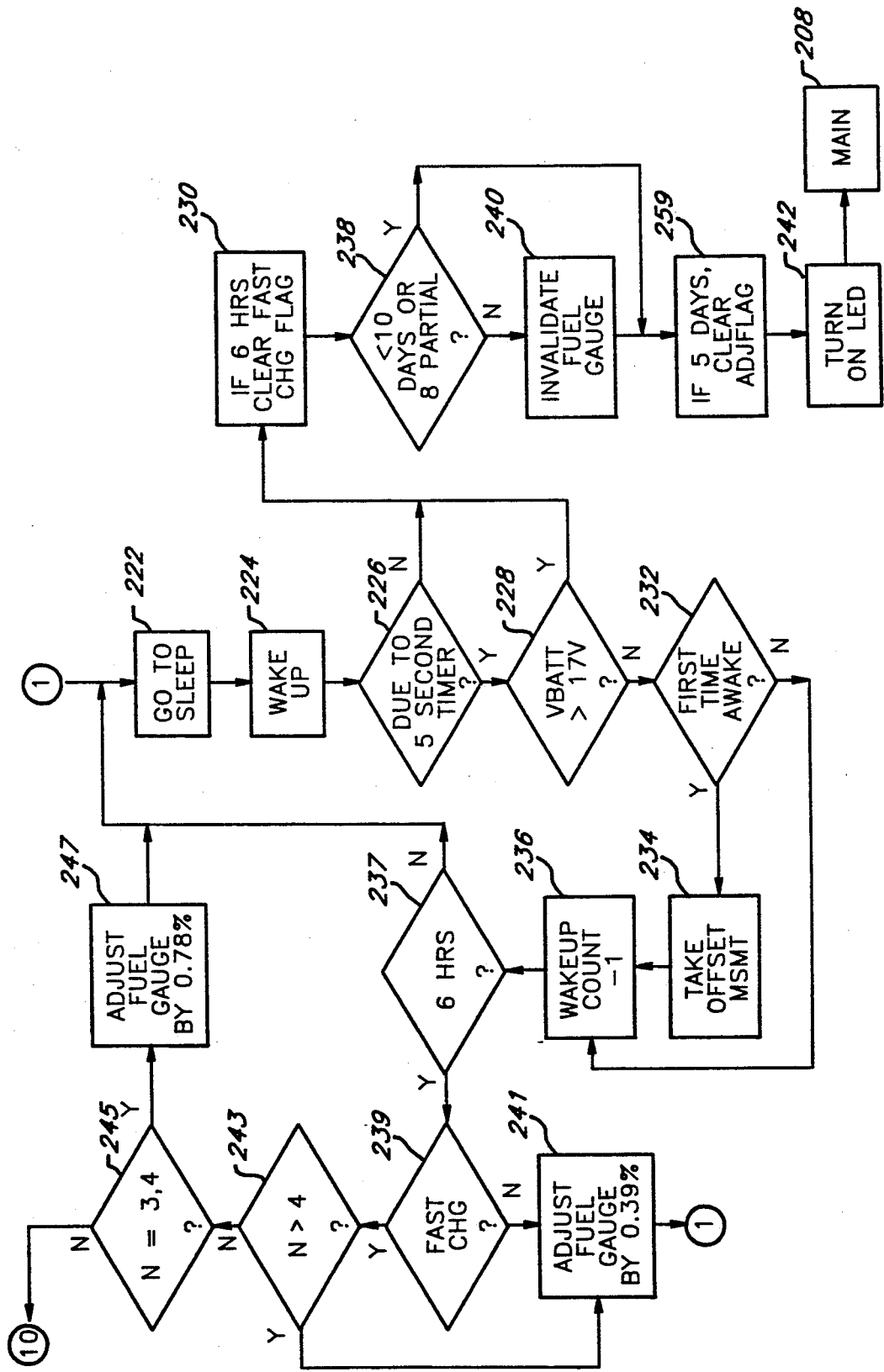
Figure 4C:
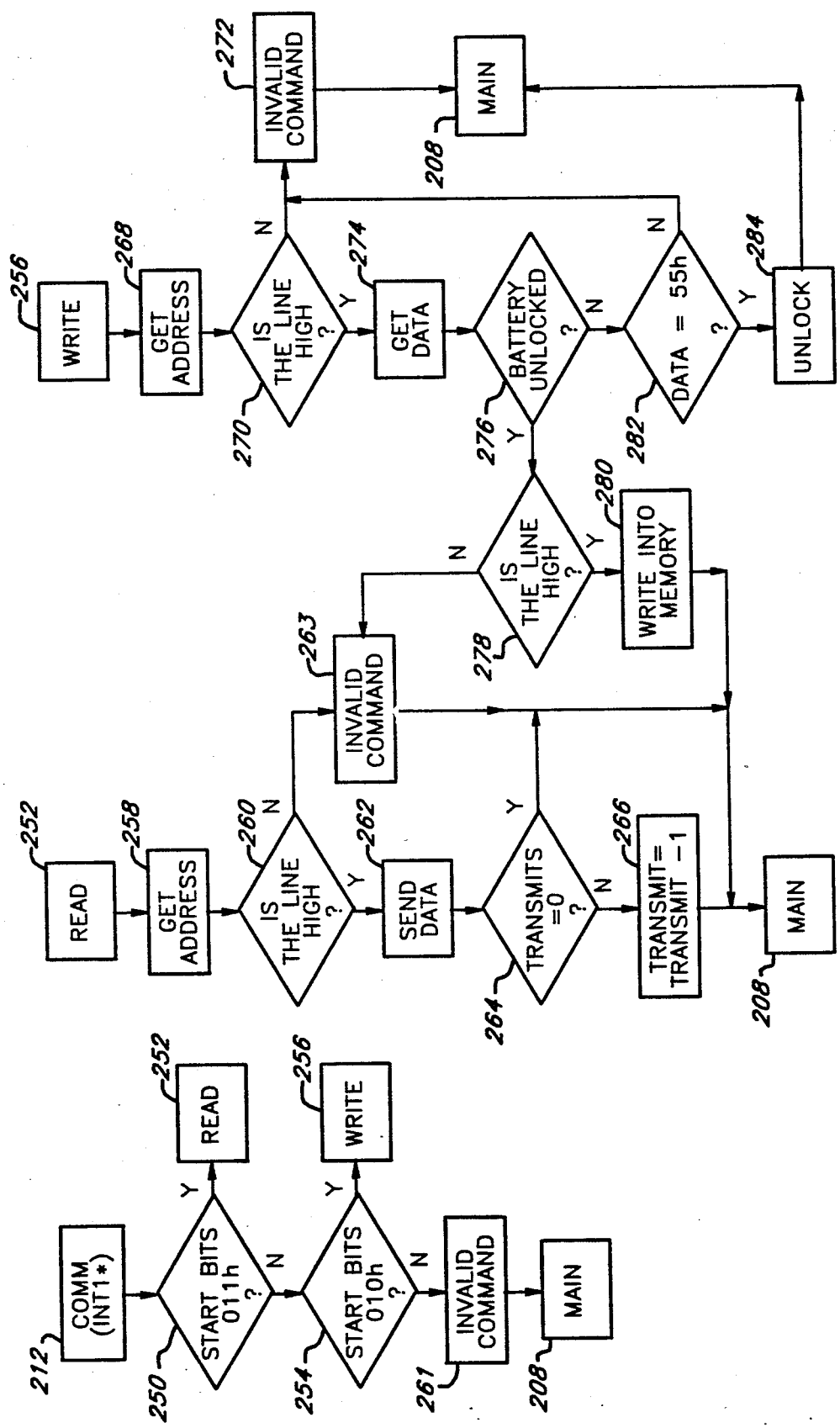
Figure 4D:
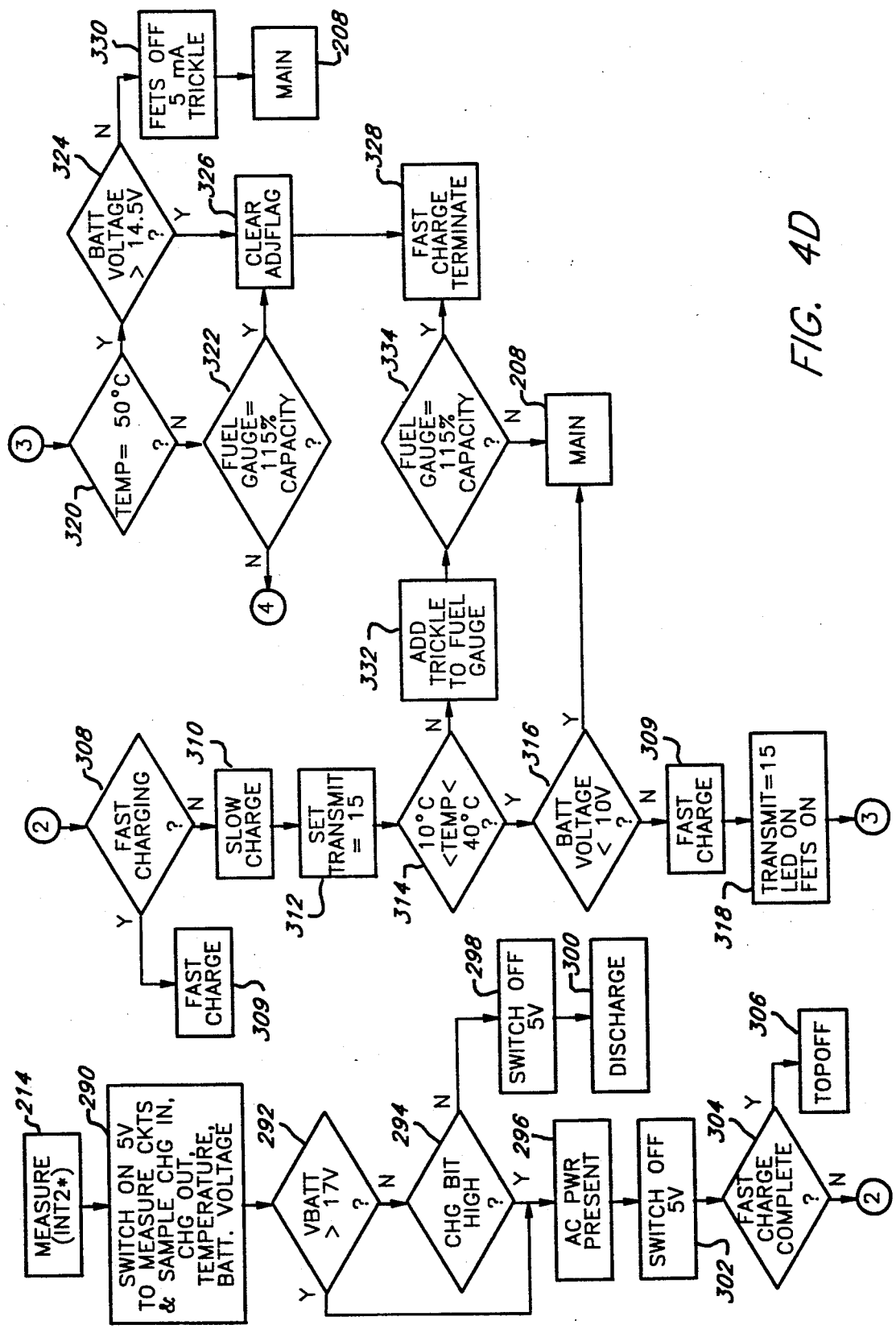
Figure 4E:
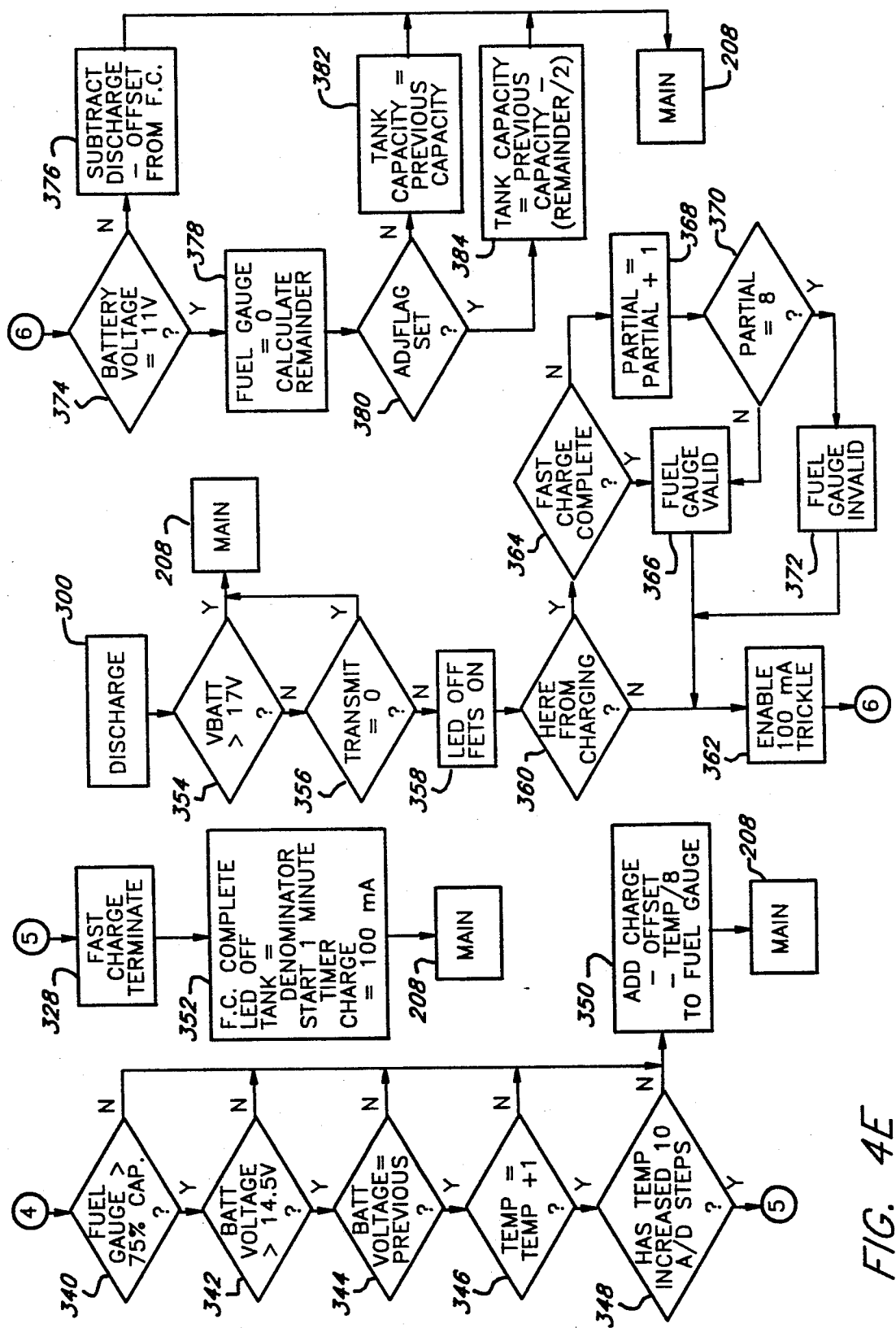

FIGS. 4A-4E are flowchart diagrams illustrating the preferred operation of the software in the microcontroller 34. Only those operations relevant to the present invention are shown, while insignificant details are omitted. FIG. 4A illustrates the main loop of the microcontroller 34 and operation when the battery pack B is not connected to an AC power source. FIG. 4B describes the serial communication link between the charge control and monitor circuit 22 and the computer system C. FIGS. 4C-4E describe the measurement of the charging parameters as well as the charging status determination including fast charge, trickle charge and discharge.

Referring now to FIG. 4A, reset step 200 indicates that the microcontroller 34 has been initially powered up or reset. The microcontroller 34 then performs initialize step 202 where the RAM 38 is initialized and loaded with predetermined variables to be used by the software. This includes space for measurements of the CHARGE, DISCHARGE, TSENS and battery 20 voltage, as well as the tank capacity or denominator and the charge level or numerator. Also, the FETSON* signal is pulled high to turn off the MOSFETS 60 and 62 to disable fast charging and discharging, the LEDON* signal is asserted high to turn off the LED 154, and the timer 40 is initialized to interrupt the microcontroller 34 at a rate of approximately 10 Hz. The battery 20 is thus initially assumed to be trickle charging. The microcontroller 34 then executes step 204 where the BATTYP signal is monitored to determine whether a NiCad or a NiMH battery is installed. A flag NICAD is set high if a NiCad battery is installed, otherwise the NICAD flag is reset low indicating a NiMH battery is installed. Also, the watchdog timer is initialized to preferably time out every 290 milliseconds (ms).

The microcontroller 34 then performs step 206 which begins the main loop of the software as indicated by a label 208. Anytime the label main 208 is encountered in the flowchart, the program returns to the main loop of the program to step 206. In step 206, the watchdog timer is again initialized. The timer 40 is enabled and begins timing the 10 Hz INTI* interrupt cycle. Operation then proceeds to step 210 which represents the occurrence of one of the two interrupts INT1* or INT2* corresponding to the INTI* or the INT2* inputs asserted low, respectively, where the main loop is exited to perform a corresponding interrupt routine. The interrupts INT1* and INT2* can occur, however, at any time during the operation of the main loop and the interrupt routines will return back to the point of interruption. The highest priority interrupt INT1* is indicated by a label 212 which occurs when the SERLINK signal is asserted low by the computer system C. The second interrupt INT2* is indicated by a label 214 which occurs when the PU1 signal is asserted low by the timer 40 preferably every 0.103 seconds indicating that the charging parameters are to be measured and stored.

If no interrupts occur, operation proceeds to step 216 which monitors the WAKEUP signal to determine if it is low, indicating a hold or sleep request. If the WAKEUP signal is high, operation loops back to step 206 as this indicates normal operation. If the WAKEUP signal is low, the microcontroller 34 performs step 218 where the VBATT signal is measured and compared to 17 volts. Recall, that if the VBATT signal is greater than 17 volts, the battery pack B is connected to the AC adapter A or to a fast charger. If the VBATT signal is greater than 17 volts, operation loops back to step 206. Otherwise, the main loop is exited and operation proceeds to step 220 where a wakeup count and a six hour count, referred to as N in FIG. 4A, are initialized. The six hour count N is initialized to zero. The wakeup count is initialized to a number 4,320 which equals the number of 5 second periods in a six hour period corresponding to the number of times the PUJT timer 43 will wake up the microcontroller 34 in six hours if the battery pack B is disconnected. Operation then proceeds to step 222 from step 220 where the microcontroller 34 is put to sleep.

the microcontroller 34 is awakened in the next step 224 when the WAKEUP signal is asserted high by either the PUJT timer 42 or the SERLINK signal being asserted high. Operation then proceeds to step 226 where the microcontroller 34 monitors the SERLINK signal to determine whether the WAKEUP signal was asserted high by the SERLINK signal or by the PUJT timer 42. If the SERLINK signal is low, the microcontroller 34 was awakened by the PUJT timer 42 and thus proceeds to step 228. Otherwise, the SERLINK signal is high so that the microcontroller 34 performs step 230. In step 228, the microcontroller 34 again measures the voltage level of the VBATT signal to determine if its signal is greater than 17 volts. If so, the battery pack B is in a system or connected to a charger and operation proceeds to step 230. If the WAKEUP signal was asserted high by the PUJT timer 42 and if the battery voltage is less then or equal to 17 volts as determined in step 228, operation proceeds to step 232 where the microcontroller 34 determines whether it has been awakened for the first time by the PUJT timer 42. This is determined if the six hour count N is zero and the wakeup count has not been decremented. If the microcontroller 34 has been awakened for the first time, operation proceeds to step 234 where the offset voltages of the amplifiers 84 and 92 are measured as described previously.

Operation then process from step 234 to step 236 where the wakeup count is decremented. If the wakeup count becomes zero, the six hour count N is incremented and the wakeup count is again preset with the number 4,320. The wakeup and six hour count N thus provide the elapsed time since the battery pack B is disconnected from AC power, thereby allowing determination of the amount of self-discharge of the battery 20 which occurs at known rates, as described in detail below. Referring back to step 232, if the microcontroller 34 has been awakened previously, operation proceeds directly to step 236.

From step 236, operation proceeds to a step 237 which determines if the wakeup count reached zero and if the six hour count N was incremented in step 236, thus indicating that sic hours has elapsed. If not, operation proceeds back to step 222 where the microcontroller 34 is put back to sleep. If six hours has elapsed, operation proceeds to a step 239 where a FAST CHARGE COMPLETE flag is checked to see if it has been previously set. The FAST CHARGE COMPLETE flag will be described further later. If the FAST CHARGE COMPLETE flag was not previously set, then the battery 20 was not fully charged before entering the self-discharge mode. In this case, operation proceeds to a step 241 where a hexadecimal number referred to as the fuel gauge, representing the charge level of the battery 20, is decreased by approximately 0.39% representing the amount of charge lost by the battery 20 due to self-discharge in six hours. This reflects experimental observation that the partially charged battery 20 loses approximately 1.5% charge per day due to self-discharge. Operation proceeds to step 222 from step 241.

If the FAST CHARGE COMPLETE flag had been previously set as determined in step 239, thus indicating that the battery 20 had completed a full charge before self-discharging, operation proceeds to a step 243 where the six hour count N is compared to the number four. If the six hour count N is greater than four, then the battery 20 has been self-discharging for more than one day since being fully charged, and the rate of self-discharge is approximately 0.39% every six hours. Thus, operation proceeds to step 241 to adjust the fuel gauge accordingly. If the six hour count N is not greater than four, then operation proceeds to a step 245 where the six hour count N is compared to the numbers three and four representing the third and fourth six hour periods of self-discharge since full charge. If the six hour count N is equal to three or four, operation proceeds to a step 247 where the fuel gauge is decreased by approximately 0.78%. From the step 247, operation proceeds to the step 222 where the microcontroller 34 is put back to sleep.

If the six hour count N is not equal to three or four in step 245, operation proceeds to a step 249 where the six hour count N is compared to the number two. If the six hour count N equals two in step 249, operation proceeds to a step 251 where the fuel gauge is decreased by approximately 1.5%. From step 251, operation proceeds to step 222. If the six hour count N is not equal to two in step 249, then operation proceeds to a step 253 where the NICAD flag is monitored. If the battery 20 is NiCad, then operation proceeds to a step 255 where the fuel gauge is decreased by approximately 3%, and then operation returns to step 222. If the battery 20 is NiMH in step 253, operation proceeds to a step 257 where the fuel gauge is decreased by approximately 6%, and then operation returns to step 222.

In summary, a fully charged NiMH battery 20 as used in the preferred embodiment self-discharges at a rate of approximately 6% the first six hours whereas a fully charged NiCad battery 20 as used in the preferred embodiment self-discharges at a rate of 3% the first six hours. If the battery 20 was fully charged before self-discharging, both battery types self-discharge at a rate of approximately 1.5% the second six hour period, at a rate of approximately 0.78% the third and fourth six hour periods and approximately 0.39% for each subsequent six hour period. A partially discharged battery 20 discharges at a rate of approximately 0.39% every six hours regardless of the battery type.

Referring back to step 230, either AC power is available or the battery pack B is connected to the computer system C. If the battery has self-discharged for at least 6 hours, then the FAST CHARGE COMPLETE flag is cleared indicating that fast charge can be initiated. Operation then proceeds to step 238, where the fuel gauge is checked for validity. The fuel gauge remains valid until there are 10 days of self-discharge or 8 partial charge cycles. If the fuel gauge is invalid, operation proceeds to step 240 where a FUEL GAUGE VALID flag is cleared to indicate that the fuel gauge is not valid. From step 238 if the fuel gauge is valid or from step 240, operation proceeds to a step 59, where a flag referred to as ADJFLAG is cleared if the battery 20 has been self-discharging for at least 5 days. The ADJFLAG flag will be described further below. From step 259, operation proceeds to a step 42, where the LED 154 is turned on by asserting the LEDON* signal low since fast charging will occur shortly. Operation then proceeds to the main loop as indicated by the label 208.

Referring now to FIG. 4B, if an INT1* interrupt occurred in the main loop as indicated by the label 12, operation proceeds to an interrupt routine starting with step 250 where the microcontroller 34 reads the first three start bits received on the SERLINK signal to determine whether a read or a write command is being received. If the start bits are 011h, then a read command is being received as indicated by a label 252. Otherwise, operation proceeds to step 254 where the start bits are compared to 010h, which indicates that a write command is being received as indicated by a label 256. If the start bits are not equal to 010h in step 254, then the command is deemed invalid and operation proceeds to step 256 where the command is ignored, and operation is returned back to the main loop as indicated by the label 208.

If it is determined that the computer system C is sending a read command, operation proceeds to step 258 where the microcontroller 34 monitors the SERLINK signal and receives an address of a location in the ROM 36 or RAM 38. After the address is received in step 258, operation proceeds to step 260 where the microcontroller 34 monitors the SERLINK signal to assure that it is high. This step is provided as a failsafe mechanism to prevent noise from being interpreted as a valid command. If the SERLINK signal is low, operation proceeds to step 262 where the microcontroller 34 determines that the command received is invalid and operation returns to the main program loop as indicated by the label 208.

If the SERLINK signal is high in step 260, operation proceeds to step 262 where the microcontroller 34 sends the data requested from the address location received. Operation then proceeds to step 264 where a TRANSMIT count is compared to 0. The TRANSMIT count provides a method to disable the discharge mode until the system is stabilized. The TRANSMIT count is initially set to 15 and the MOSFETs 60 and 62 are turned off preventing accidental or temporary discharge. Discharge is not enabled until 15 consecutive read cycles occur. If the TRANSMIT count is equal to 0, operation proceeds to the main loop of the program. Otherwise, operation proceeds to step 266 where the TRANSMIT count is decremented. From step 266, operation proceeds back to the main loop.

If the start bits are proper for a write command in step 254, operation proceeds to step 268 where an address for write command is received by the microcontroller 34. Write commands are typically only performed by a manufacturer to initialize parameters when the battery pack B is new and before being shipped to a user. The battery pack B is then locked by a write command to prevent write access by the user. Operation proceeds to step 270 where the SERLINK signal is monitored exactly as done in step 260. If the SERLINK signal is low, operation proceeds to step 272 where the write command is deemed invalid and ignored and operation proceeds back to the main loop as indicated by the label 208. If the SERLINK signal is high in step 270, operation proceeds to step 274 where data to be written at the received address is retrieved.

Operation then proceeds to step 276 which determines if the battery is locked or unlocked. The battery is initially locked so that an unlock command must first be sent before any data can be written into the memory of the microcontroller 34. If the battery is unlocked in step 276, operation proceeds to step 278 where the SERLINK signal is again checked to determine if the data is valid. If the SERLINK signal is high in step 278, operation proceeds to step 280 where the data received in step 274 is written into the memory of the microcontroller 34 at the received address. Preferably one address contains the locked bit, so that a final write command can lock the battery. Operation proceeds from step 280 back to the main loop as indicated by the label 208. If the SERLINK signal is low in step 278, operation proceeds to step 262 where the command is considered invalid, and then operation returns back to the main loop of the program.

In step 276, if the battery is locked, then operation proceeds to step 282 where the data is compared to a hexadecimal value, preferably 55h, representing an unlock command. If the data does not equal 55h in step 282, the battery will remain locked and operation proceeds to step 272 where the command is considered invalid. If the data equals 55h in step 282, operation proceeds to step 284 where the battery is unlocked so that subsequent data can be written into the microcontroller 34. Operation proceeds from step 284 back to the main loop.

Referring now to FIG. 4C, if an interrupt INT2* is received as indicated by a label 214, operation proceeds to step 290 where the microcontroller 34 switches on the switched SWVCC signal by asserting the SWVCCON* signal low. The SWVCC signal powers the charge, discharge, temperature and voltage measurement circuits 46–52, respectively, as well as the temperature sensor 24. The microcontroller 34 then samples the CHARGE, DISCHARGE and the TSENS signals through the AIN0–AIN2 inputs, respectively, and also samples the VBATT signal and then the NEG signal with the PRBV signal through the AIN3 input. Each of the signals listed above are measured and converted to hexadecimal values and stored in the RAM 38.

Since the A/D converter 41 converts approximately 19.6 millivolts per count and the CHARGE and DISCHARGE signals have a voltage level of approximately 19.25 millivolts per 10 milliamps of current through the battery 20, and also since the microcontroller 34 samples every 0.103 seconds, each count of the A/D converter 41 corresponds to approximately 1 MA—second. The tank capacity and fuel gauge values also correspond to 1 MA—seconds per count, or hexadecimal bit, providing direct correspondence between the tank capacity, fuel gauge and the charge and discharge rates so that the microcontroller 34 can update directly without mathematical manipulation, though true multiplications could be performed if desired.

Operation then proceeds to step 292, where the VBATT signal is compared to 17 volts. If the VBATT signal is less than or equal to 17 volts, operation proceeds to step 29 where the microcontroller 34 monitors the CHG signal to determine whether the battery 20 is being charged or discharged. If the VBATT signal is greater than 17 volts in step 292 or if the CHG signal is high in step 294, then AC power is available and the battery 20 is charging, so that operation proceeds to step 296 where the microcontroller 34 sets an ACPWR flag. If the CHG signal is low in step 294, operation proceeds to step 98 where the SWVCCON* signal is pulled high, thereby turning off the switched SWVCC signal. The ACPWR flag is cleared, and the battery 20 is determined at this point to be discharging, as indicated by a label 300. Operation then proceeds to step 354 from step 298 as described later.

From step 296, operation proceeds to step 302, where the microcontroller 34 turns off the switched SWVCC signal and then operation proceeds to step 304, where the FAST CHARGE COMPLETE flag is monitored to determine whether fast charge has been completed. If so, operation proceeds to step 386 to provide a topoff charge to the battery 20 as indicated by a label 306. Otherwise, if the FAST CHARGE COMPLETE flag is not set in step 304, operation proceeds to step 308, where a fast charging flag FASTFLG is monitored to determine if the battery 20 is currently fast charging. If the FASTFLG flag is set, operation proceeds to step 309, described below. If not, operation proceeds to step 310, which indicates a slow charge. Operation then proceeds to step 312, where the TRANSMIT count is set equal to 15. Thus, the TRANSMIT count should not reach zero when slow charging.

From step 312 operation proceeds to step 314, where it is determined whether the temperature of the battery 20 is greater than 10° and less than 40° C., which is the acceptable temperature range for fast charging. If the temperature is between 10° and 40° C., then operation proceeds to step 316, where the voltage of the battery 20 is compared to a low voltage level, preferably 10 volts. If the battery voltage is 10 volts or greater in step 316, operation proceeds to step 309, indicating fast charge. The FASTFLG is set in step 309. Operation then proceeds to step 318, where the transmit parameter is set to 15, the LED 154 is turned on, and the FETSON* signal is asserted low, thereby activating the MOSFETs 60 and 62 to initiate fast charging. The TRANSMIT count should not reach zero when fast charging.

From step 318, operation proceeds to step 320, where the temperature is compared to 50° C. The temperature of the battery 20 will not be allowed to rise above 50° C. since otherwise it is considered unsafe. If the battery temperature is not equal to 50° C., then operation proceeds to step 322, where the fuel gauge value is multiplied by 115% and compared to a hexadecimal number referred to as the denominator representing the full charge capacity of the battery 20. If the fuel gauge has not reached the level of 115% of the denominator, operation proceeds to step 340, which will be described below. If the fuel gauge has reached the 115% value of the denominator, operation proceeds to step 326 where the ADJFLAG flag is cleared indicating that the tank capacity or denominator will not be adjusted, as further described below. Operation then proceeds to step 328 indicating that fast charge is to be terminated, and the FASTFLG flag is cleared accordingly.

Referring back to step 320, if the temperature has increased to 50° C., then operation proceeds to step 324 where the voltage of the battery 20 is compared to a maximum charging voltage level, preferably 14.5 volts. If the battery voltage is greater than 14.5 volts in step 324, operation proceeds to step 326 where the ADJFLAG flag is cleared and fast charge will be terminated as described above. In this manner, when the temperature has reached 50° C. and the battery voltage has climbed above the maximum voltage level, or the fuel capacity value has risen to 115% of the denominator, the tank capacity or denominator will not be later adjusted based on the fuel gauge and fast charge will be terminated.

Referring back to step 324, if the voltage of the battery 20 has not increased above the maximum voltage level of 14.5 volts, then operation proceeds to step 30 where the FETSON* signal is asserted high, thereby turning off the MOSFETs 60 and 62, and the TCOFF* signal is asserted low, thereby turning off the MOSFET 72. In this manner, the battery 20 is slow charged through the resistor 70 at the maintenance rate of 5 milliamps. This indicates that the temperature of the battery 20 is too high but that it is not fully charged, so that fast charge is temporarily suspended and the lower trickle rate is used to allow the temperature to decrease. Fast charge is subsequently resumed when the temperature decreases to 40° C. Operation then proceeds to the main loop as indicated by the label 208.

Referring back to step 314, if the temperature is not within 10° and 40° C., then operation proceeds to step 332 where the fuel gauge is increased. Since a trickle charge has been applied to the battery 20 for 0.1 seconds since the last interrupt INTI* and update, the trickle charge value and the time are multiplied and then converted to a hexadecimal equivalent of the coulomb count added to the battery 20, which is then added to the fuel gauge. Operation then proceeds from step 332 to step 334, where the fuel gauge is compared to 115% of the denominator, similarly to step 322. If the fuel gauge has reached 115% of the value of the denominator, operation proceeds to step 328, indicating fast charge termination as described before. If the fuel gauge has not increased to the 115% level, operation returns back to the main loop as indicated by the label 208.

Recall that from step 322 operation proceeds to step 340 if the fuel gauge reached 115% of the denominator. Referring now to FIG. 4D, in step 340 the level of the fuel gauge is compared to 75% of the denominator or tank capacity. If the fuel gauge has not increased to the 75% level, then operation proceeds to step 350, where the most recent charge is converted to a charge level and added to the fuel gauge, subtracting out the voltage offsets as well as the hexadecimal value of the temperature as obtained from the A/D converter 41 divided by 8 due to charge inefficiency. As the battery 20 is being fast charged, its temperature increases so that some of the charge energy is converted to heat rather than being converted to charge energy. The higher the temperature, the less efficient charging becomes until the battery 20 will not accept further charge. Thus, the charge inefficiency factor is proportional to the temperature and is subtracted out to estimate actual charge received by the battery 20. The charge inefficiency factor is only subtracted out during a fast charge.

Operation then proceeds from step 350 back to the main program loop as indicated by the label 208. If the fuel gauge is greater than or equal to 75% of the denominator in step 340, operation proceeds to step 342, where the battery voltage is compared to the maximum voltage level of 14.5 volts. If the battery voltage is less than the maximum voltage level, operation proceeds to step 350. Otherwise, operation proceeds to step 344 which determines if the battery voltage has changed from the last measurement taken approximately 0.1 seconds before in the previous iteration. If the battery voltage has changed in step 344 from the previous calculation of battery voltage, operation proceeds to step 350. Otherwise, operation proceeds to step 346 to determine if the temperature has increased from the previous measurement. If not, operation proceeds to step 350. Otherwise, operation proceeds to step 348, which determines if the temperature has increased by a hexadecimal value of 10, corresponding to approximately 2° C. If the temperature has not increased by 2° C., operation proceeds to step 350. Otherwise, if the temperature has increased by 2° C. in step 348, operation proceeds to step 328, indicating that the fast charge is terminated where the FASTFLG is cleared. Also, a PARTIAL count is cleared which is a count of the number of partial charge cycles since last full charge.

Summarizing steps 340–350, when the battery 20 is fast charging, if the fuel gauge rises to at least the 75% level of the denominator and the voltage of the battery 20 is at least 14.5 volts but is not increasing while the temperature rises at least 2° C., the fast charge terminate point has been achieved and fast charge is terminated. Otherwise, fast charge resumes and the fuel gauge is increased by the added charge, taking into account temperature-based charge inefficiency.

When step 328 is encountered, operation proceeds to step 352, where the FAST CHARGE COMPLETE flag is set and the LED 154 is turned off. Regardless of the level of the fuel gauge, the fuel gauge is set equal to the denominator since the denominator represents full capacity and the battery 20 is fully charged. Additionally, the FUEL GAUGE VALID flag is set. A one minute timer is also initiated in step 352 and a charge of 100 milliamps through the battery 20 is applied by the microcontroller 34 by pulling the TCOFF* signal high. This is referred to as a topoff charge where the battery 20 is charged with 100 milliamps of trickle current for one minute after a full charge has been completed. Operation then proceeds to the main program loop as indicated by the label 208.

Any time the discharge label 300 is encountered, operation proceeds to step 354 where the VBATT signal is compared to 17 volts to determine if AC power is available. If so, operation proceeds to the main program loop as indicated by the label 208. Otherwise, operation proceeds to step 356 which, compares the TRANSMIT count to 0. If the TRANSMIT count is not 0 in step 356, operation back proceeds to the main program loop and discharge is not entered. Recall that 15 consecutive read cycles, each decrementing the TRANSMIT count, must occur before discharge is entered. If the TRANSMIT count is zero, operation proceeds to step 358, where the LED 154 is turned off and the FETSON* signal is asserted low, thereby turning on the MOS- FETs 60 and 62. The battery 20 is then discharging into the computer system C and the AC adapter A is not connected.

From step 358, operation proceeds to step 360, which monitors a CHRGFLG flag to determine whether the battery 20 had been charging before entering the discharge mode. If the CHRGFLG flag was not previously set, operation proceeds to step 362, where the microcontroller 34 enables the 100 milliamp trickle charge by setting the TCOFF* signal high and also setting a flag OFFTRICK, which is subsequently cleared when the battery receives a topoff charge. Operation then proceeds to step 374, further described below. If the CHRGFLG flag was previously set in step 360, operation proceeds to step 364 where the microcontroller 34 monitors the FAST CHARGE COMPLETE flag. If the FAST CHARGE COMPLETE flag was previously set, operation proceeds to step 366, where the FUEL GAUGE VALID flag is set and operation proceeds to step 362. In step 364, if the FAST CHARGE COMPLETE flag had not been previously set, operation proceeds to step 368 where the PARTIAL count is incremented. Operation then proceeds to step 370, where if the PARTIAL count is not equal to 8, operation proceeds to step 366 where the FUEL GAUGE VALID flag is set, indicating that the fuel gauge is valid. Otherwise, if the PARTIAL is equal to 8 in step 370, operation proceeds to step 372 where the FUEL GAUGE VALID flag is cleared, indicating the fuel gauge is no longer valid. Since the battery 20 has received eight consecutive partial charge cycles, experience has shown that the fuel gauge becomes inaccurate. From step 372, operation proceeds to step 362.

From step 362, operation proceeds to step 374, where the voltage of the battery 20 is compared to the full discharge voltage level of 11 volts. If the battery voltage is not equal to 11 volts, operation proceeds to step 376, where the amount of discharge is calculated and subtracted from the fuel gauge taking into consideration the offset of the amplifier 92. The value from the A/D converter can be directly subtracted as the value corresponds to MA - seconds, no explicit multiplication being necessary as the factors chosen inherently perform the multiplication.

Operation then proceeds from step 376 to the main program loop as indicated by the label 208. In step 74, if the battery voltage is equal to 11 volts, thus indicating a fully discharged battery, operation proceeds to step 378, where the fuel gauge value is stored in a parameter referred to as REMAINDER and the fuel gauge is set equal to zero. Operation then proceeds to step 380 where the ADJFLAG flag is checked. If the ADJFLAG flag has been previously cleared, operation proceeds to step 382, where the tank capacity or denominator is set equal to the previously calculated tank capacity, since the new fuel gauge value is considered inaccurate. Operation then proceeds to the main program loop. If the ADJFLAG flag has been previously set as determined in step 380, operation proceeds to step 384, where the tank capacity is updated by subtracting the REMAINDER divided by 2. This subtraction provides a way to correct for individual battery differences and capacity changes over time. After a series of discharge cycles the remainder should approach zero, resulting in an accurate determination of the tank capacity for each individual battery pack B. The value of 2 is selected as the preferred convergence factor, unity possibly converging faster but also being more prone to errors and higher factors converging slower than desired. Operation then proceeds back to the main loop as indicated by the label 208.

Referring now to FIG. 4E, any time the label 306 is encountered in the flow chart, operation proceeds to step 386 which reads the OFFTRICK flag. If the OFFTRICK flag has been previously cleared, the battery 20 has already been topped off and operation proceeds to step 388, indicating that the microcontroller 34 will not alter the denominator or tank capacity value, and operation proceeds back to the main loop as indicated by the label 208. If the battery 20 has not been previously topped off in step 386, operation proceeds to step 390, which monitors the 1 minute timer If the timer has timed out in step 390, indicating that the present topoff charge is complete, operation proceeds to step 392, where the microcontroller 34 sets the trickle current to 5 milliamps by asserting the TCOFF* signal low. The OFFTRICK flag is also cleared. Then operation proceeds to step 388. If the 1 minute timer has not timed out in step 390, then the fuel gauge is updated in step 394 by dividing the hexadecimal value corresponding to 100 milliamps by 4 to develop the proper coulomb charge value and adding this to the fuel gauge. Operation then returns to the main program loop.

The computer system C interrupts the charge control and fuel gauge circuit periodically, preferably every four seconds, through the SERLINK signal with read commands to retrieve the denominator or tank capacity, the numerator or charge level and the discharge rate as well as other charging parameters if desired. The computer system C calculates the fuel level or percentage of remaining charge by dividing the numerator by the denominator. Also the time remaining before complete discharge is calculated by dividing the charge level by the discharge rate. The computer system C preferably provides the fuel level and time remaining to the user on its display.

To summarize the operation of the software program of the microcontroller 34, it constantly determines whether an AC power source is available to charge the battery 20. If so, the microcontroller 34 monitors the voltage, temperature and charge level to determine whether a fast or a trickle charge should be applied, and the battery 20 is charged accordingly. If the battery 20 is fast charging, the voltage, temperature and charge level are monitored to determine when to terminate fast charge. If AC power is not present, the microcontroller 34 allows discharge if connected to the computer system C and if the computer system C is turned on.

The microcontroller 34 also constantly monitors the charge and discharge current through the battery 20 and calculates the amount of charge added or removed. A fuel gauge is constantly updated to maintain the charge level. If charge is to be added, temperature inefficiency is accounted for. Self-discharge is also monitored during periods of non-use and subtracted from the fuel gauge. Upon full discharge, the charge capacity of the battery 20 is updated if the fuel gauge is valid.

The microcontroller 34 stores the charge information and provides it upon request through a serial link to the computer system C.

The foregoing disclosure and description of the invention are illustrative and explanatory thereof, and various changes in the size, shape, materials, components, circuitry, wiring connections and contacts, as well as in the details of the illustrated circuitry and construction and method of operation may be made without departing from the spirit of the invention.

We claim:

1. An apparatus for charging a battery comprising:
   a battery;
   means for charging said battery at a high rate;
   means for charging said battery at a low rate;
   means for determining the temperature of said battery;
   means for determining the voltage of said battery;
   means for indicating a predetermined time interval; and
   means coupled to said high rate battery charging means, said low rate battery charging means, said battery temperature monitoring means, said battery voltage determining means and said predetermined time interval means for disabling said high rate battery charging means and enabling said low rate battery charging means when said battery voltage has remained constant for said predetermined interval and said battery temperature has increased by a predetermined amount during said predetermined interval and for indicating that said battery is fully charged upon said disabling of said high rate battery charging means.

2. The apparatus of claim 1, further comprising:
   means for maintaining a charge level value of said battery; and
   wherein said means for disabling and enabling is coupled to said battery charge level value maintaining means and said means for disabling and enabling disables said high rate battery charging means and enables said low rate battery charging means and indicates full charge on the further condition that said battery charge level value is greater than a predetermined amount.

3. The apparatus of claim i, wherein said means for disabling and enabling for disables said high rate battery charging means, enables said low rate battery charging means and indicates full charge on the further condition that said battery voltage is above a predetermined level.

4. The apparatus of claim 3, further comprising:
   means for maintaining a charge level value of said battery; and
   wherein said means for disabling and enabling is coupled to said battery charge level value maintaining means and said means for disabling and enabling disables said high rate battery charging means and enables said low rate battery charging means and indicates full charge on the further condition that said battery charge level value is greater than a predetermined amount.

5. The apparatus of claim 4, further comprising:
   means for monitoring the charging current of said battery and increasing said battery charge level based on said charging current of said battery; and
   means for monitoring the discharging current of said battery and reducing said battery charge level based on said discharging current of said battery.

* * * * *

UNITED STATES PATENT AND TRADEMARK OFFICE
CERTIFICATE OF CORRECTION

PATENT NO. : 5,200,689

DATED : APRIL 6, 1993

INVENTOR(S) : ARMANDO INTERIANO, ET AL.

It is certified that error appears in the above-identified patent and that said Letters Patent is hereby corrected as shown below:

In Col. 22, Line 7, please replace "i" with --1--.

Signed and Sealed this

Seventh Day of December, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,200,689
DATED : April 6, 1993
INVENTOR(S) : Armando Interiano et al.

Figure 4F:
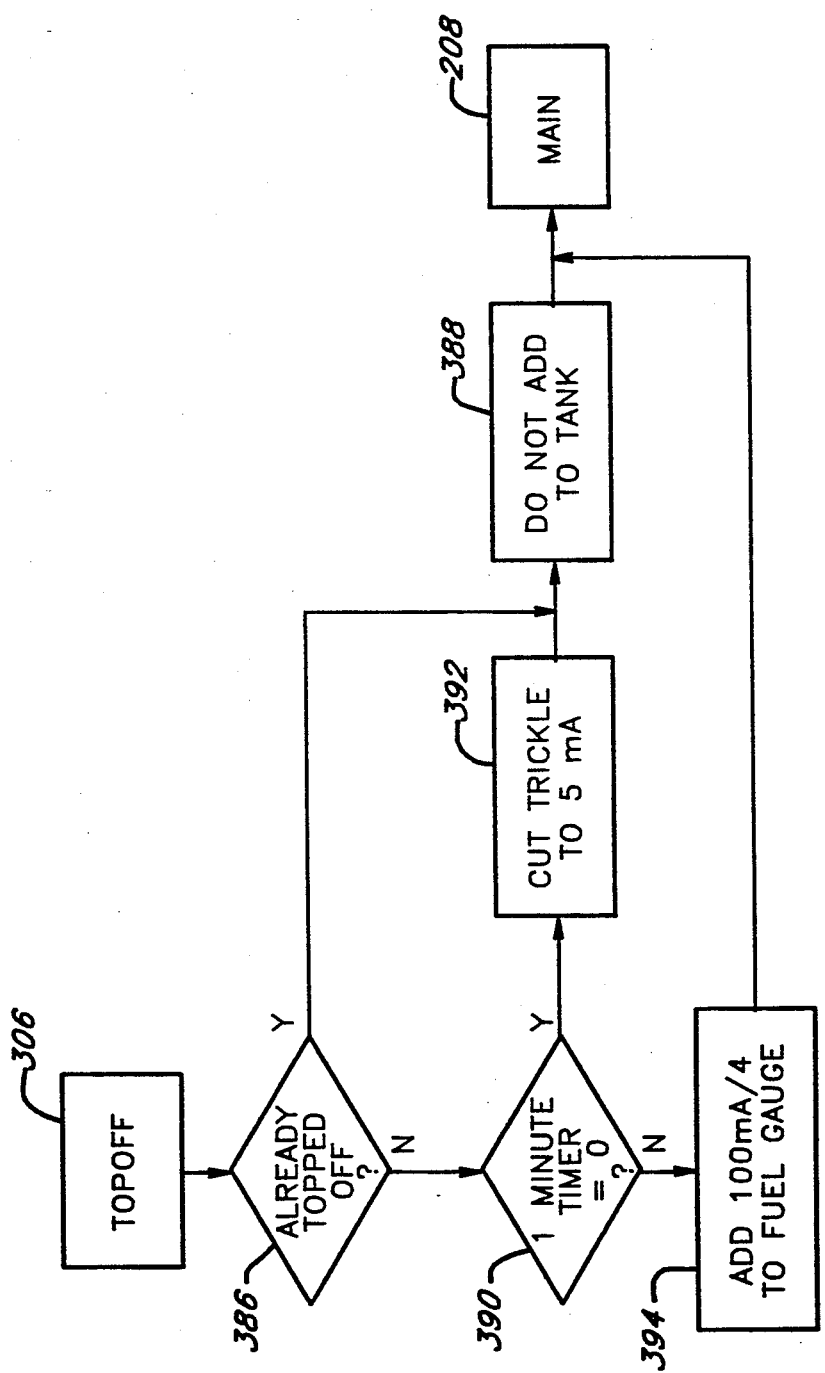

It is certified that error appears in the above-identified patent and that said Letters Patent is hereby corrected as shown below:

Column 3,
Line 43, delete "FIG. 4E" and insert therefor -- FIG 4F --.

Column 11,
Line 19, delete "FIG. 4E" and insert therefor -- FIG. 4F --.
Line 23, delete "FIG. 4A illustrates" and insert therefor -- FIGS. 4A and 4B illustrate --.
Line 28, delete "FIGS. 4C-4E" and insert therefor -- FIGS. 4D-4F --.

Column 12,
Line 29, after "step 222" insert -- (FIG. 4B) --.
Line 31, before "the microcontroller" insert -- Referring now to FIG. 4B, --.

Column 13,
Line 45, before "the six hour" delete "If" and insert therefor -- Referring back to FIG. 4B --.

Column 14,
Line 5, after "step 230" insert -- in FIG. 4B --.
Line 25, delete "FIG. 4B" and insert therefor -- FIG. 4C --.
Line 26, delete "12," and insert therefor -- 212, --.
Line 38, delete "step 256" and insert therefor -- step 261 --.
Line 51, delete "step 262" and insert therefor -- step 263 --.

Column 15,
Line 34, delete "step 262" and insert therefor -- step 263 --.
Line 48, delete "FIG. 4C," and insert therefor -- FIG. 4D, --.

Column 17,
Line 55, delete "FIG. 4D," and insert therefor -- FIG. 4E, --.

UNITED STATES PATENT AND TRADEMARK OFFICE
CERTIFICATE OF CORRECTION

PATENT NO. : 5,200,689
DATED : April 6, 1993
INVENTOR(S) : Armando Interiano et al.

It is certified that error appears in the above-identified patent and that said Letters Patent is hereby corrected as shown below:

Column 20,
Line 4, delete "FIG. 4E," and insert therefor -- FIG. 4F, --.

Signed and Sealed this

Twenty-seventh Day of September, 2005

JON W. DUDAS
*Director of the United States Patent and Trademark Office*